United States Patent
Akiyama et al.

(10) Patent No.: US 10,658,570 B2
(45) Date of Patent: May 19, 2020

(54) METHOD FOR PRODUCING COMPOSITE WAFER HAVING OXIDE SINGLE-CRYSTAL FILM

(71) Applicant: SHIN-ETSU CHEMICAL CO., LTD., Tokyo (JP)

(72) Inventors: Shoji Akiyama, Annaka (JP); Makoto Kawai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 247 days.

(21) Appl. No.: 15/577,456

(22) PCT Filed: Jun. 1, 2016

(86) PCT No.: PCT/JP2016/066283
§ 371 (c)(1),
(2) Date: Nov. 28, 2017

(87) PCT Pub. No.: WO2016/194977
PCT Pub. Date: Dec. 8, 2016

(65) Prior Publication Data
US 2018/0151797 A1 May 31, 2018

(30) Foreign Application Priority Data
Jun. 2, 2015 (JP) ................................. 2015-112333

(51) Int. Cl.
*H01L 41/312* (2013.01)
*H01L 41/335* (2013.01)
(Continued)

(52) U.S. Cl.
CPC ............ *H01L 41/335* (2013.01); *B32B 18/00* (2013.01); *B32B 37/18* (2013.01);
(Continued)

(58) Field of Classification Search
CPC ......... C30B 15/14; C30B 15/16; C30B 25/12; C30B 33/02; C30B 33/06; C30B 29/30;
(Continued)

(56) References Cited

U.S. PATENT DOCUMENTS 4,371,419 A * 2/1983 Fukuda ................... C30B 15/00
117/27
5,374,564 A 12/1994 Bruel
(Continued)

FOREIGN PATENT DOCUMENTS

EP 1 401 022 A1 3/2004
EP 1 986 218 A1 10/2008
(Continued)

OTHER PUBLICATIONS

Jul. 19, 2016 Written Opinion issued in International Patent Application No. PCT/JP2016/066282.
(Continued)

*Primary Examiner* — Carl J Arbes
(74) *Attorney, Agent, or Firm* — Oliff PLC

(57) ABSTRACT

A composite wafer has an oxide single-crystal film transferred onto a support wafer, the film being a lithium tantalate or lithium niobate film, and the composite wafer being unlikely to have cracking or peeling caused in the lamination interface between the film and the support wafer. More specifically, a method of producing the composite wafer, includes steps of: implanting hydrogen atom ions or molecule ions from a surface of the oxide wafer to form an ion-implanted layer inside thereof; subjecting at least one of the surface of the oxide wafer and a surface of the support wafer to surface activation treatment; bonding the surfaces together to obtain a laminate; heat-treating the laminate at 90° C. or higher at which cracking is not caused; and applying ultrasonic vibration to the heat-treated laminate to
(Continued)

split along the ion-implanted layer to obtain the composite wafer.

6 Claims, 3 Drawing Sheets

(51) Int. Cl.
    *H01L 21/02*     (2006.01)
    *H01L 21/762*     (2006.01)
    *B32B 18/00*     (2006.01)
    *B32B 37/18*     (2006.01)
    *B32B 38/00*     (2006.01)
    *B32B 38/10*     (2006.01)
    *C23C 14/48*     (2006.01)
    *C23C 14/58*     (2006.01)
    *H01L 41/187*     (2006.01)
    *C30B 29/30*     (2006.01)
    *H03H 9/02*     (2006.01)

(52) U.S. Cl.
    CPC .......... *B32B 38/0036* (2013.01); *B32B 38/10* (2013.01); *C23C 14/48* (2013.01); *C23C 14/5833* (2013.01); *H01L 21/02* (2013.01); *H01L 21/76254* (2013.01); *H01L 41/1873* (2013.01); *H01L 41/312* (2013.01); *B32B 2457/00* (2013.01); *C30B 29/30* (2013.01); *H03H 9/02559* (2013.01)

(58) Field of Classification Search
    CPC ..... B32B 18/00; B32B 37/18; B32B 38/0036; B32B 2457/00; C23C 14/48; C23C 14/5833; H01L 21/76254; H01L 41/1873; H01L 41/312; H01L 41/335; H03H 9/02559
    See application file for complete search history.

(56) References Cited

U.S. PATENT DOCUMENTS

| | | | | |
|---|---|---|---|---|
| 5,526,448 | A * | 6/1996 | Nagata | G02F 1/035 385/1 |
| 5,668,057 | A * | 9/1997 | Eda | H01L 27/20 257/E27.006 |
| 5,910,699 | A * | 6/1999 | Namba | H03H 3/04 310/320 |
| 6,319,430 | B1 * | 11/2001 | Bordui | C01G 33/00 252/584 |
| 6,348,094 | B1 * | 2/2002 | Shiono | C30B 15/00 117/2 |
| 6,540,827 | B1 | 4/2003 | Levy et al. | |
| 6,803,028 | B2 * | 10/2004 | Gadkaree | C30B 33/00 423/594.17 |
| 7,323,050 | B2 * | 1/2008 | Shiono | C30B 29/30 117/86 |
| 8,748,294 | B2 * | 6/2014 | Akiyama | H01L 21/76254 257/347 |
| 9,837,301 | B2 * | 12/2017 | Konishi | H01L 21/76254 |
| 10,095,057 | B2 * | 10/2018 | Iwamoto | G01C 19/64 |
| 2002/0102777 | A1 | 8/2002 | Sakaguchi et al. | |
| 2003/0056718 | A1 | 3/2003 | Kawahara et al. | |
| 2005/0066879 | A1 * | 3/2005 | Shiono | C30B 29/30 117/2 |
| 2010/0088868 | A1 | 4/2010 | Kando et al. | |
| 2010/0107388 | A1 | 5/2010 | Iwamoto | |
| 2011/0227068 | A1 | 9/2011 | Akiyama | |
| 2012/0247686 | A1 | 10/2012 | Stefanescu | |
| 2012/0280355 | A1 | 11/2012 | Akiyama | |
| 2013/0072009 | A1 | 3/2013 | Bruel | |
| 2015/0200129 | A1 | 7/2015 | Konishi et al. | |
| 2016/0056068 | A1 | 2/2016 | Hu et al. | |

FOREIGN PATENT DOCUMENTS

| | | |
|---|---|---|
| JP | 3048201 B2 | 6/2000 |
| JP | 2002-231912 A | 8/2002 |
| JP | 2003-095798 A | 4/2003 |
| JP | 2010-109949 A | 5/2010 |
| JP | 2010-161359 A | 7/2010 |
| JP | 2011-138932 A | 7/2011 |
| JP | 2013-149853 A | 8/2013 |
| JP | 2015-046486 A | 3/2015 |
| WO | 2014/017369 A1 | 1/2014 |
| WO | 2014/153923 A1 | 10/2014 |

OTHER PUBLICATIONS

Jul. 19, 2016 International Search Report issued in International Patent Application No. PCT/JP2016/066282.
Jul. 19, 2016 International Search Report issued in International Patent Application No. PCT/JP2016/066284.
Jul. 19, 2016 Written Opinion issued in International Patent Application No. PCT/JP2016/066284.
Jul. 19, 2016 Written Opinion issued in International Patent Application No. PCT/JP2016/066281.
Jul. 19, 2016 International Search Report issued in International Patent Application No. PCT/JP2016/066281.
U.S. Appl. No. 15/577,456, filed Nov. 28, 2017 in the name of Akiyama et al.
U.S. Appl. No. 15/577,405, filed Nov. 28, 2017 in the name of Akiyama et al.
U.S. Appl. No. 15/577,683, filed Nov. 28, 2017 in the name of Akiyama et al.
Nov. 9, 2018 Extended European Search Report issued in European Patent Application No. 16803410.6.
Henttinen, K., et al. "Mechanically induced Si layer transfer in hydrogen-implanted Si wafers". Applied Physics Letters, vol. 76, No. 17, pp. 2370-2372, 2000.
Taiyo Yuden Co., Ltd., "Temperature compensation technology for SAW-Duplexer used in RF front end of smartphone", [online], Nov. 8, 2012.
A. Tauzin, et al., "3-inch single-crystal LiTaO3 films onto metallic electrode using Smart CutTM technology", Electronics Letters, vol. 44, No. 13, pp. 822-824, 2008.
Weill Liu, et al. "Fabrication of single-crystalline LiTaO3 film on silicon substrate using thin film transfer technology", J. Vac. Sci. Technol. B26(1), pp. 206-208, 2008.
Jul. 19, 2016 International Search Report issued in International Patent Application No. PCT/JP2016/066283.
Jul. 19, 2016 Written Opinion issued in International Patent Application No. PCT/JP2016/066283.
Dec. 20, 2018 Extended European Search Report issued in European Patent Application No. 16803409.8.
Dec. 20, 2018 Extended European Search Report issued in European Patent Application No. 16803411.4.
Dec. 20, 2018 Extended European Search Report issued in European Patent Application No. 16803412.2.
Oct. 2, 2019 Office Action issued in U.S. Appl. No. 15/577,683.
Oct. 3, 2019 Office Action issued in U.S. Appl. No. 15/577,615.
Oct. 3, 2019 Office Action issued in U.S. Appl. No. 15/577,405.

* cited by examiner

METHOD FOR PRODUCING COMPOSITE WAFER HAVING OXIDE SINGLE-CRYSTAL FILM

TECHNICAL FIELD

The invention relates to a method of producing a composite wafer. More specifically, the invention relates to a method of producing a composite wafer having an oxide single-crystal film on a support wafer.

BACKGROUND ART

In the field of mobile communication devices typified by smartphones, a drastic increase in communication traffic and multi-functionality have recently progressed. In order to meet the increase in communication traffic, the number of bands has been increased, while the mobile communication devices are required to have various functions without enlarging the shape of them. Various parts to be used for these mobile communication devices must therefore be smaller and have higher performance.

An oxide single crystal such as lithium tantalate (LT) and lithium niobate (LN) is a typical piezoelectric material and has been used widely as a material of surface acoustic wave (SAW) devices. The oxide single crystal used as a piezoelectric material enables band broadening because an electromechanical coupling factor, which indicates the conversion efficiency of electromagnetic energy into dynamic energy, is large. However, it has low stability against a temperature change, and the frequency to which it can respond varies with the temperature change. The low stability against the temperature change owes to the thermal expansion coefficient of the oxide single crystal.

For improving the temperature stability in the case where the oxide single crystal is used as a piezoelectric material, there is provided, for example, a method comprising steps of: laminating, with an oxide single-crystal wafer, a material having a thermal expansion coefficient smaller than that of the oxide single crystal, more specifically, a sapphire wafer; and thinning (e.g. grinding) the oxide single-crystal wafer side of the resulting laminate to a thickness of from several to tens of μm to suppress the influence of thermal expansion of the oxide single crystal (Non-Patent Document 1). In this method, however, the oxide single-crystal wafer is ground after lamination, so that a large portion of the oxide single-crystal wafer is wasted. Thus, it is inferior in terms of efficient use of the material. In addition, lithium tantalate or lithium niobate used as the oxide single crystal is an expensive material so that there is a demand for a method involving highly efficient use of the material and being capable of reducing the waste so as to reduce a production cost.

As an example of the method of producing a SOI wafer, the Small-Cut method, in short, comprises steps of: laminating a silicon wafer having a hydrogen ion-implanted layer with a support wafer, and heat-treating the resulting laminate around 500° C. to thermally split the laminate along the ion-implanted layer (Patent Document 1). In order to enhance the efficient use of an oxide single-crystal wafer, an attempt has been made to use the oxide single-crystal wafer instead of the silicon wafer used in the Small-Cut method to form an oxide single-crystal film on the support wafer (Non-Patent Documents 2 and 3).

Non-Patent Document 2 reports a method of producing a LTMOI (lithium-tantalate-metal-on-insulator) structure comprising steps of: forming a 121-nm thick Cr metal layer on a surface of a lithium tantalate wafer having an ion-implanted layer; laminating the wafer with a $SiO_2$ substrate having a thickness of hundreds of nm, while keeping the metal layer therebetween; heat-treating the resulting laminate at a temperature of from 200 to 500° C. to split the laminate along the ion-implanted layer, thereby transferring a lithium tantalate film onto the $SiO_2$ substrate via the metal layer; and laminating the lithium tantalate wafer with the surface of the $SiO_2$ substrate on the side opposite to the surface to which the lithium tantalate film has been transferred. Non-Patent Document 3 reports a method of thermally transferring a lithium tantalate film onto the silicon wafer comprising steps of: laminating a silicon wafer with a lithium tantalate wafer having an ion-implanted layer; and heat-treating the resulting laminate at 200° C. to split the laminate along the ion-implanted layer.

PRIOR ART DOCUMENT

Patent Document

[Patent Document 1] Japanese Patent No. 3048201

Non-Patent Documents

[Non-Patent Document 1] Taiyo Yuden Co., Ltd., "Temperature compensation technology for SAW-Duplexer used in RF front end of smartphone", [online], Nov. 8, 2012, Dempa Shimbun High Technology, [searched on Mar. 20, 2015], internet (URL: http://www.yuden.co.jp/jp/product/tech/column/20121108.html)

[Non-Patent Document 2] A Tauzin et al., "3-inch single-crystal $LiTaO_3$ films onto metallic electrode using Smart Cut™ technology", Electric Letters, 19 Jun. 2008, Vol. 44, No. 13, p. 822

[Non-Patent Document 3] Weill Liu et al., "Fabrication of single-crystalline $LiTaO_3$ film on silicon substrate using thin film transfer technology", J. Vac. Sci. Technol. B26 (1), January/February 2008, p. 206

SUMMARY OF THE INVENTION

Problem to be Solved by the Invention

An oxide single crystal such as lithium tantalate (LT) and lithium niobate (LN) is hard and very fragile. In addition, it has a markedly large thermal expansion coefficient compared with those of silicon, glass and sapphire as shown in FIG. 2. The oxide single crystal therefore has such a drawback that heat-treating at a high temperature after lamination with a different kind of wafer such as a silicon, glass or sapphire wafer may cause peeling or cracking between the wafers thus laminated due to a difference in thermal expansion coefficient. For example, a difference in thermal expansion coefficient between lithium tantalate and sapphire, which is typically used as a support wafer and has a particularly large thermal expansion coefficient, is as large as $7\times10^{-6}$/K (=7 ppm/K) or more, as can be confirmed from FIG. 2.

According to the Non-Patent Document 2, by selecting the structure of interposing the metal layer and the $SiO_2$ substrate between the lithium tantalate wafer and the lithium tantalate film, the lithium tantalate film can be transferred, while suppressing peeling or cracking of the wafer attributable to the difference in thermal expansion during the heat treatment. In this method, however, an underlying substrate is made of lithium tantalite, which is a material also used for the film, so that poor temperature stability, which is the above-described problem of a piezoelectric material, cannot be improved. In addition, the film cannot be transferred unless heat-treated at 200° C. or higher. Further, the structure of interposing the metal layer narrows the range of applications. Still further, expensive lithium tantalate must be used excessively for suppressing cracking of the wafer, leading to an increase in a production cost.

Non-Patent Document 3 describes heat treatment at a temperature of from 200 to 800° C. However, heat treatment only at 200° C. was carried out in an example of transferring the lithium tantalate film onto the silicon wafer by the Smart-Cut method. In this example, there is no description on whether or not the lithium tantalate film was transferred onto the entire surface of the silicon wafer. The present inventors have carried out a verification test on splitting during the heat treatment at 200° C. by using a method similar to that used in Non-Patent Document 3, and found that the lithium tantalate film was transferred onto not the entire surface of the silicon wafer but a small area of the surface. In particular, the lithium tantalate film was not transferred at all at the peripheral area of the silicon wafer. This is presumed to occur because the wafers formed into the laminate were warped due to a difference in thermal expansion during the heat treatment, and peeling occurred along the lamination interface with the lithium tantalate wafer at the peripheral area of the silicon wafer. Even if the heat treatment is done at 200° C. or higher, it is impossible to prevent the warp of the wafers formed into the laminate due to the difference in thermal expansion and to stably transfer the lithium tantalate film onto the entire surface of the silicon wafer, as described above.

Solution to the Problem

The inventors have carried out an extensive investigation and have found a method of producing a low-cost composite wafer, comprising an oxide single-crystal film on a support wafer and being unlikely to peel or crack at the lamination interface, unexpectedly by selecting a support wafer material having a thermal expansion coefficient largely different from that of the oxide single crystal, specifically, by selecting a support wafer material having a thermal expansion coefficient of 7 ppm/K or more smaller than that of an oxide single crystal. This approach is different from the conventional approach of suppressing generation of a stress by using materials having thermal expansion coefficients close to each other. More specifically, the inventors have found a method in which an oxide single-crystal wafer having an ion-implanted layer formed using a predetermined hydrogen ion implantation dose and a support wafer having a thermal expansion coefficient smaller than that of the oxide single crystal are laminated together, taking advantage of a bonding force between the wafers generated by surface activation treatment or the like; the resulting laminate is heat-treated at a temperature low enough not to cause thermal splitting, the ion-implanted layer of the laminate is exposed to ultrasonic vibration to accelerate embrittlement of the ion-implanted layer for splitting, while maintaining the connection with the lamination interface.

In an aspect of the invention, there is provided a method of producing a composite wafer having an oxide single-crystal film on a support wafer, comprising steps of:

implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;

subjecting at least one of the surface of the oxide single-crystal wafer and a surface of a support wafer to be laminated with the oxide single-crystal wafer to surface activation treatment;

after the surface activation treatment, bonding the surface of the oxide single-crystal wafer to the surface of the support wafer to obtain a laminate;

heat-treating the laminate at a temperature of 90° C. or higher at which cracking is not caused; and a step of applying ultrasonic vibration to the heat-treated laminate to split the laminate along the ion-implanted layer to obtain an oxide single-crystal film transferred onto the support wafer;

wherein an implantation does of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$.

Effect of the Invention

According to the invention, by using the production method, there can be provided a composite wafer having high adhesion at the lamination interface between the support wafer and the oxide single-crystal film, being unlikely to cause peeling or cracking, and having the oxide single-crystal film with a uniform thickness transferred onto the entire surface of the support wafer. The oxide single-crystal wafer separated through the transfer of the oxide single-crystal film onto the support wafer can be used again for the production of a composite wafer so that use of the production method can bring cost reduction.

MODE FOR CARRYING OUT THE INVENTION

Figure 1:
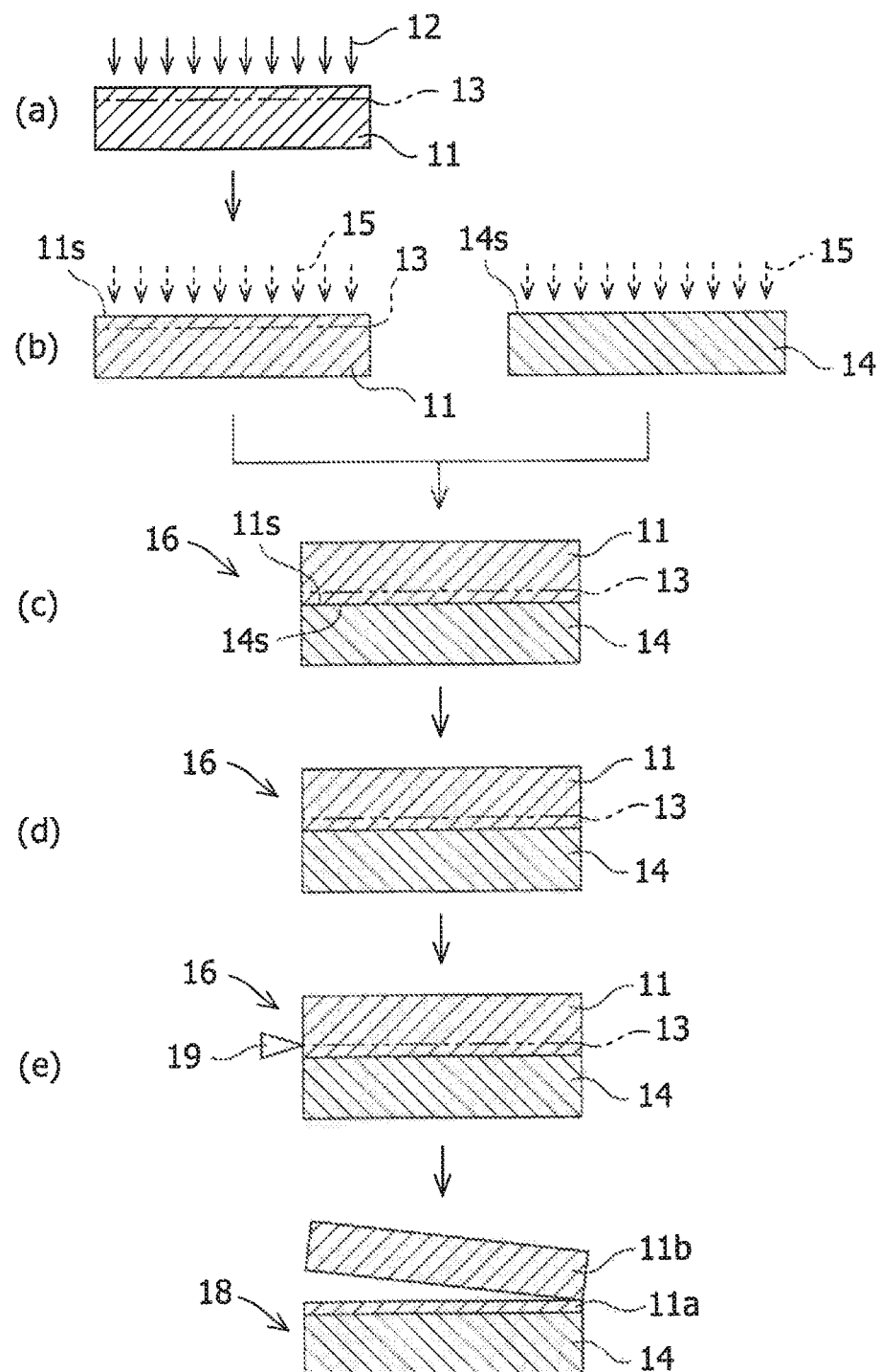
FIG. 1 is a schematic view of the method of producing a composite wafer in one of the embodiments of the invention.

Embodiments for carrying out the invention will hereinafter be described in detail, but the scope of the invention is not limited by them.

In one of the embodiments of the invention, there is provided a method of producing a composite wafer having an oxide single-crystal film on a support wafer.

The support wafer may be, for example, a wafer made of a material having a thermal expansion coefficient of at least 7 ppm/K smaller than that of the oxide single-crystal wafer to be laminated. Examples of the support wafer include a sapphire wafer, a silicon wafer, a silicon wafer with an oxide film, and a glass wafer. The size of the support wafer is not particular limited, and may be, for example, a wafer having a diameter of from 75 to 150 mm and a thickness of from 0.2 to 0.8 mm. The support wafer is not particularly limited, and a commercially available wafer may be used. For example, the silicon wafer with an oxide film is a silicon wafer having an oxide film formed at least on the surface to be laminated, wherein the oxide film may be formed on the surface of a silicon wafer by heat-treating the silicon wafer at 700 to 1200° C. in an air atmosphere. The thickness of the oxide film of the silicon wafer with an oxide film is not particularly limited, and is preferably from 10 to 500 nm.

The oxide single crystal is a compound made from lithium, a metal element such as tantalum or niobium, and oxygen. Examples of the oxide single crystal include lithium tantalate ($LiTaO_3$) and lithium niobate ($LiNbO_3$). The oxide single crystal is preferably a lithium tantalate single crystal or a lithium niobate single crystal particularly when it is used for a laser element, a piezoelectric element, a surface acoustic wave element or the like. The oxide single crystal is typically used in the form of a wafer. The size of the oxide single-crystal wafer is not particularly limited, and may have, for example, a diameter of from 75 to 150 mm and a thickness of from 0.2 to 0.8 mm. The oxide single-crystal wafer may be selected from commercially available wafers, or may be produced by using one of known methods (for example, JP 2003-165795A, and JP 2004-079061 T which is the national phase publication of PCT application) including the Czochralski process, or may be produced in combination of the steps contained by the known methods.

Each of the support wafer and the oxide single-crystal wafer preferably has a surface roughness RMS of 1.0 nm or less at the surface to be bonded together. The surface roughness RMS of more than 1.0 nm may generate a gap at the lamination interface and the gap may cause peeling. A wafer having a surface roughness RMS of more than 1.0 nm may be subjected to chemical mechanical polishing (CMP) to have the desired surface roughness. The surface roughness RMS may be evaluated, for example, by atomic force microscopy (AFM).

Hydrogen ions are implanted into the oxide single-crystal wafer through a surface thereof to form an ion-implanted layer inside the oxide single-crystal wafer. The ion-implanted layer is formed by implanting a predetermined dose of hydrogen atom ions ($H^+$) or hydrogen molecule ions ($H_2^+$) with an implantation energy enough to form an ion-implanted layer at a desired depth from the surface of the oxide single-crystal wafer. The implantation energy may be, for example, from 50 to 200 keV in this implantation. The implantation dose of hydrogen atom ions ($H^+$) is from $5.0 \times 10^{16}$ atom/$cm^2$ to $2.75 \times 10^{17}$ atom/$cm^2$. The implantation dose of less than $5.0 \times 10^{16}$ atom/$cm^2$ does not cause embrittlement of the ion-implanted layer in a later step. The implantation dose of more than $2.75 \times 10^{17}$ atom/$cm^2$ generates microcavities in the surface from which the ions have been implanted, so that the wafer having a desired surface roughness cannot be obtained because of the unevenness in the wafer surface. The implantation dose of hydrogen molecule ions ($H_2^+$) is from $2.5 \times 10^{16}$ atoms/$cm^2$ to $1.37 \times 10^{17}$ atoms/$cm^2$. The implantation dose of less than $2.5 \times 10^{16}$ atoms/$cm^2$ does not cause embrittlement of the ion-implanted layer in a later step. The implantation dose of more than $1.37 \times 10^{17}$ atoms/$cm^2$ generates microcavities in the surface from which the ions have been implanted, so that the wafer from having a desired surface roughness cannot be obtained because of the unevenness in the wafer surface. The implantation dose of hydrogen atom ions may be twice the dose of hydrogen molecule ions.

Next, at least one of the surface of the oxide single-crystal wafer from which the ions have been implanted and the surface of the support wafer to be laminated with the oxide single-crystal wafer is subjected to surface activation treatment. Both of the surface of the oxide single-crystal wafer from which the ions have been implanted and the surface of the support wafer to be laminated with the oxide single-crystal wafer may be subjected to surface activation treatment. At least one of the surfaces is required to be subjected to surface activation treatment. As a result of the surface activation treatment, the desired degree of a bond strength can be obtained even at relatively low temperature of the heat treatment after the step of bonding (i.e. laminating) without requiring high temperature heat treatment to enhance a bond strength. Particularly when a hard and fragile oxide single-crystal wafer such as a lithium tantalate or lithium niobate wafer and a support wafer having a thermal expansion coefficient of much smaller than that of the oxide single-crystal wafer are laminated together after the surface activation treatment as described above, a large shear stress generated in parallel with the lamination interface due to a difference in thermal expansion coefficient between the oxide single-crystal wafer and the support wafer at a relatively low temperature in the later step may accelerate fracture not at the lamination interface provided with a bond strength enough to compete with the shear stress by the surface activation treatment but at the ion-implanted layer to the degree of not causing splitting.

Examples of the surface activation treatment include ozone water treatment, UV ozone treatment, ion beam treatment, and plasma treatment. When the ozone water treatment is selected, the surface can be activated with active ozone, for example, by introducing an ozone gas into pure water to obtain ozone water, and immersing the wafer in the resulting ozone water. When UV ozone treatment is selected, the surface can be activated, for example, by retaining the wafer in an atmosphere in which active ozone has been generated by irradiating the air or an oxygen gas with short-wavelength UV light (having, for example, a wavelength of about 195 nm). When ion beam treatment is selected, the surface can be activated, for example, by applying an ion beam such as Ar to the wafer surface in high vacuum (e.g. less than $1 \times 10^{-5}$ Pa) to allow highly active dangling bonds to be exposed on the surface. When plasma treatment is selected, the surface is treated with plasma, for example, by exposing the wafer placed in a vacuum chamber to a plasma gas under reduced pressure (for example, from 0.2 to 1.0 mTorr) for about 5 to 60 seconds. As the plasma gas, an oxygen gas is used for oxidizing the surface, while a hydrogen gas, a nitrogen gas, an argon gas, or a mixture thereof may be used for not oxidizing the surface. When the wafer surface is treated with plasma, organic matters thereon are removed by oxidation and further, the wafer surface is activated because of the increased number of OH groups on the surface.

After the surface activation treatment, the surface of the oxide single-crystal wafer from which the ions have been implanted is bonded to the surface of the support wafer to obtain a laminate. The oxide single-crystal wafer and the support wafer are laminated together preferably at a temperature in the vicinity of room temperature (including the room temperature), for example, from 10 to 50° C. The composite wafer as a product is often used around room temperature so that the temperature at the bonding (i.e. laminating) is desirably based on this temperature range. The temperature at the bonding may be a temperature of the location where the step of bonding takes place, that is, an ambient temperature or an atmospheric temperature in an apparatus. The temperature at the bonding (i.e. laminating) may be controlled, for example, by selecting the atmospheric temperature in a lamination apparatus. The term "room temperature" means an ambient temperature measured without heating or cooling an object. The room temperature is not particularly limited, and is, for example, from 10 to 30° C., preferably around 25° C.

Next, the laminate is heat-treated at a temperature of 90° C. or higher and, for example, at the temperature of not causing cracks at the lamination interface. The heat treatment at a temperature of lower than 90° C. may cause peeling at the lamination interface because the bond strength at the lamination interface between the oxide single-crystal wafer and the support wafer is insufficient. The temperature of the heat treatment may be changed in accordance with the support wafer to be used. For example, when the support wafer is a sapphire wafer, the temperature in the step of heat-treating is preferably from 90 to 225° C., more preferably from 90 to 200° C. When the support wafer is a silicon wafer or a silicon wafer with an oxide film, the temperature is preferably from 90 to 200° C., more preferably from 90 to 175° C. When the support wafer is a glass wafer, the temperature is preferably from 90 to 110° C., more preferably from 90 to 100° C. Heat-treating the laminate at a temperature of 90° C. or higher and of not causing a crack makes it possible not only to improve a bonding force at the lamination interface between the support wafer and the oxide single-crystal wafer but also to facilitate embrittlement of the ion-implanted layer in a later step. Examples of a heater include, but not particularly limited to, a heat treatment furnace and an oven. As the temperature of the laminate, the atmospheric temperature in the furnace or oven, which is measured, for example, by using a thermocouple placed therein, may be used. The heat treatment time at the above-described temperature is not particularly limited unless cracking or peeling takes place. The heat treatment time may be from 10 minutes to tens of hours, for example, up to 100 hours. For example, when the heat treatment temperature is 90° C. or more and less than 110° C., the heat treatment time of from 10 minutes to 100 hours is preferred. When the heat treatment temperature is 110° C. or more and less than 175° C., the heat treatment time of from 10 minutes to 60 hours is preferred. When the heat treatment temperature is 175° C. or more and less than 200° C., the heat treatment time of from 10 minutes to 24 hours is preferred. When the heat treatment temperature is 200° C. or more and less than 225° C., the heat treatment time of from 10 minutes to 12 hours is preferred. In the invention, the step of heat-treating can be simplified because the laminate can be heat-treated without providing the laminate with a protection wafer.

The heat-treated laminate is preferably controlled to a temperature in the vicinity of room temperature (including the room temperature), for example, from 10 to 50° C. It is preferably allowed to stand, or cooled with a cooler such as an air blower, until it reaches the temperature. For example, the heat-treated laminate may be allowed to stand in a room controlled to 25° C. to obtain the laminate of a desired temperature. Cooling the laminate to a temperature in the vicinity of room temperature similar to the temperature at the bonding (i.e. laminating) to obtain the laminate can reduce a stress to be applied to the laminate so that a crack or defect is not likely to be generated in the laminate in the later step of applying ultrasonic vibration to the laminate to split the laminate.

Next, ultrasonic vibration is applied to the heat-treated laminate to split the laminate along the ion-implanted layer to obtain an oxide single-crystal film transferred onto the support wafer. The ultrasonic wave is an elastic vibration wave (sonic wave) having a high vibration frequency. A method of applying ultrasonic vibration to the laminate is not particularly limited, and the ultrasonic vibration may be applied, for example, by using a vibrator or by bringing a wedge-like blade to which a ultrasonic wave has been applied, such as a ultrasonic cutter, into contact with a side surface of the laminate, for example, an end portion of the ion-implanted layer. The frequency of the ultrasonic wave is not particularly limited insofar as it can embrittle the ion-implanted layer without affecting the lamination interface, and is preferably from 20 to 40 kHz. As another method of applying ultrasonic vibration to the laminate, the ultrasonic vibration may be applied via a liquid by using a water tank equipped with a vibrator, such as ultrasonic washer, and immersing the laminate in the water tank to which ultrasonic waves have been applied. When the ultrasonic vibration is applied to the laminate via the liquid, the laminate can be split along the ion-implanted layer more reliably by immersing the laminate for from 1 to 60 minutes in the water tank to which ultrasonic vibration has been applied. The frequency in this case is preferably from 26 kHz to 1.6 MHz. The above-described two methods may be used in combination.

When ultrasonic wave is applied, an optional reinforcement such as vacuum chuck or electrostatic chuck may be preferably fixed on one or both surfaces of the laminate. For example, the reinforcement may be attached to a support wafer-side surface of the laminate or an oxide single-crystal wafer-side surface of the laminate, or both surfaces of the laminate. The vacuum chuck is not particularly limited, and examples thereof include a vacuum chuck made of porous polyethylene, alumina or the like. The electrostatic chuck is not particularly limited, and examples thereof include an electrostatic chuck made of ceramics such as silicon carbide or aluminum nitride. The shape of the vacuum chuck or electrostatic chuck is not particularly limited, and is preferably greater than the diameter of the laminate. The reinforcement allows the laminate to split reliably along the ion-implanted layer without splitting at a place other than the ion-implanted layer or cracking of the laminate, when the ultrasonic vibration is applied to the laminate.

The temperature of the laminate during the application of ultrasonic vibration is a temperature in the vicinity of room temperature (including room temperature) without heating or cooling or by heating or cooling, for example, from 10 to 50° C., more preferably from 25 to 30° C. As the temperature of the laminate during the application of ultrasonic vibration, an atmospheric temperature around the laminate may be used. For example, it may be a temperature determined by measuring the atmospheric temperature in a furnace or oven with a thermocouple placed therein, it may be a temperature in the room of a workshop, or it may be the temperature of water in the water tank. The temperature of the laminate during the application of ultrasonic vibration to the laminate has a predetermined preferable range with respect to the temperature at the bonding (i.e. laminating) to obtain a laminate. For example, a difference in the temperature at the bonding to obtain a laminate and the temperature of the laminate during the application of ultrasonic application is preferably in a range of from 0 to 40° C. As the difference becomes closer to 0° C., the result becomes more preferable. When the difference is beyond the predetermined preferable range, peeling or cracking may be caused at the lamination interface of the laminate. By adjusting the difference between the temperature at the bonding and the temperature during the application of ultrasonic vibration to fall within a predetermined range, a warp stress resulting from thermal expansion can be reduced to the minimum and generation of defects and the like can be minimized. The step of bonding (i.e. laminating) to obtain a laminate is commonly carried out at an atmospheric temperature (from 25 to 30° C.) under an environment such as a clean room so that the step of applying ultrasonic vibration is also carried out desirably at the same atmospheric temperature of from about 25 to 30° C.

By using the above-described method, a composite wafer comprising a support wafer, and an oxide single-crystal film, which is a lithium tantalate or lithium niobate film, on the support wafer can be obtained. The thickness of the oxide single-crystal film of the resulting composite wafer corresponds to the implantation depth of hydrogen ions during the hydrogen ion implantation and is preferably from 100 to 1000 nm. The surface of the oxide single-crystal film may be optionally ground.

Figure 2:
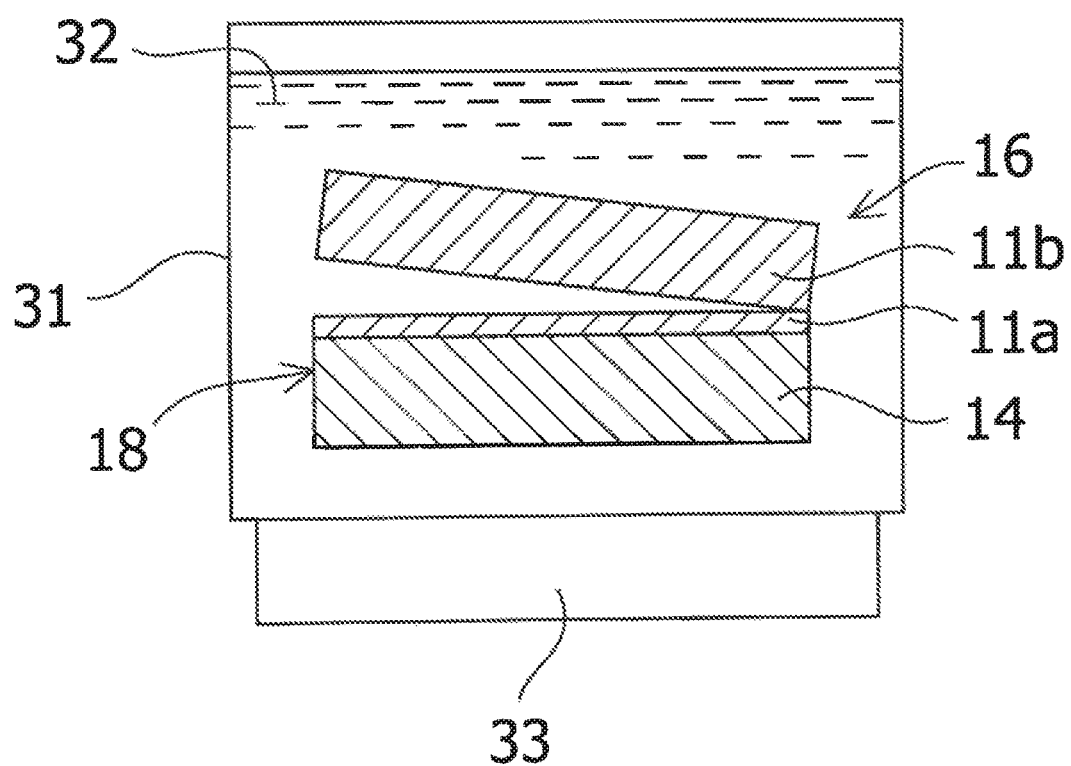
FIG. 2 is a conceptual diagram of another embodiment in the step of applying ultrasonic vibration to the laminate.
Figure 3:
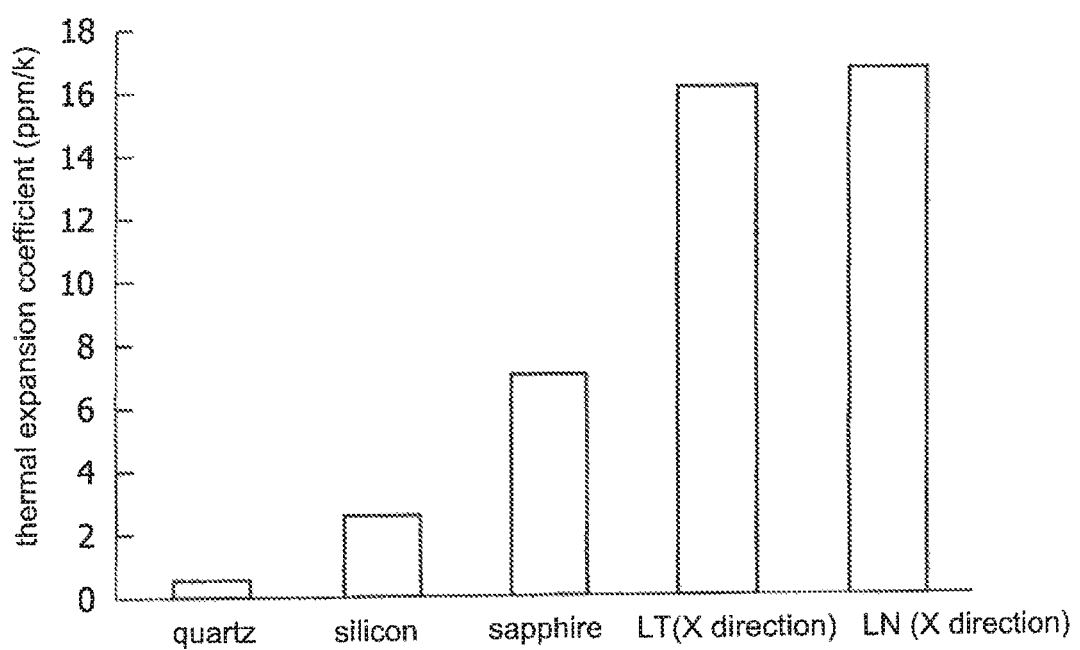
FIG. 3 shows comparison in thermal expansion coefficient among various materials.

According to the invention, the method of producing a composite wafer is not particularly limited, and one of the embodiments is shown in FIG. 1. Hydrogen ions 12 are implanted into an oxide single-crystal wafer 11 through a surface thereof to form an ion-implanted layer 13 inside the oxide single-crystal wafer 11 (in step a). The surface 11s of the oxide single-crystal wafer 11 from which the ions have been implanted and the surface 14s of a support wafer 14 to be laminated with the oxide single-crystal wafer are both subjected to surface activation treatment by exposing them to an ion beam 15 (in step b). After the surface activation treatment, the surface 11s of the oxide single-crystal wafer from which the ions have been implanted is bonded to the surface 14s of the support wafer to obtain a laminate 16 (in step c). The laminate 16 thus obtained is heat-treated at a temperature of 90° C. or higher (in step d). By bringing a wedge-like blade 19 of a ultrasonic cutter into contact with a side surface of the heat treated laminate 16, that is, an end portion of the ion-implanted layer 13, and applying ultrasonic vibration to the laminate 16, the oxide single-crystal wafer can be split along the ion-implanted layer 13 to remove a portion 11b of the oxide single-crystal wafer and obtain a composite wafer 18 having an oxide single-crystal film 11a transferred onto the support wafer 14 (in step e). Another embodiment of the step e is shown in FIG. 2. In this step e, the heat-treated laminate 16 is immersed in a water tank 31 equipped with a vibrator 33, ultrasonic waves are applied to the water tank 31 so that the ultrasonic vibration is applied to the laminate 16 via a liquid 32 to split the oxide single-crystal wafer along the ion-implanted layer 13 to remove a portion 11b of the oxide single-crystal wafer and obtain a composite wafer 18 having an oxide single-crystal film 11a transferred onto a support wafer 14.

EXAMPLES

<Experiment 1>

As a support wafer, a sapphire wafer having a diameter of 100 mm and a thickness of 0.35 mm was used. As an oxide single-crystal wafer, a lithium tantalate wafer having a diameter of 100 mm and a thickness of 0.35 mm was used. The surface roughness RMS of each surface of the sapphire wafer and the lithium tantalate wafer to be bonded together was determined using an atomic force microscope to be 1.0 nm or less.

The respective surfaces of the sapphire wafer and the lithium tantalate wafer to be bonded together were subjected to surface activation by plasma treatment with a plasma activation apparatus in a nitrogen atmosphere. Next, the surface-activated surfaces of the sapphire wafer and the lithium tantalate wafer were bonded together at room temperature (25° C.) to obtain a laminate. Each of the laminates thus obtained was heated to a temperature of 70, 80, 90, 100, 110, 125, 150, 175, 200, 225, 250, or 275° C. and heat-treated at the temperature for 24 hours. A heat treatment oven was used as a heat-treating unit, and the atmospheric temperature in the oven measured with a thermocouple was used as the temperature of the laminate. The result of appearance inspection of each laminate thus obtained is shown in Table 1. The appearance inspection was performed visually. The laminate without cracking or chipping was evaluated as "A", the laminate having fine cracking was evaluated as "B", and broken laminate was evaluated as "F". It is confirmed that the laminate samples obtained using a sapphire substrate as the support wafer and the heat treatment at 70 to 225° C. had neither cracking nor chipping.

<Experiment 2>

Laminates were obtained and heat-treated in the same manner as in Experiment 1 except that a silicon wafer having a diameter of 100 mm and a thickness of 0.35 mm was used as the support wafer, and each laminate thus obtained was heated to a temperature of 70, 80, 90, 100, 110, 125, 150, 175, 200, or 225° C. and heat-treated at the temperature for 24 hours. Each of the surface of the silicon wafer and the surface of the lithium tantalate wafer to be bonded together had a surface roughness RMS of 1.0 nm or less. The result of the appearance inspection of each laminate thus obtained is shown in Table 1. It is confirmed that the laminate samples obtained using a silicon wafer as the support wafer and the heat treatment at 0 to 200° C. had neither cracking nor chipping.

<Experiment 3>

Laminates were obtained and heat-treated in the same manner as in Experiment 1 except that a silicon wafer with an oxide film containing a silicon wafer having a diameter of 100 mm and a thickness of 0.35 mm and a 100-nm oxide film on the silicon wafer was used as the support wafer, and each laminate thus obtained was heated to a temperature of 70, 80, 90, 100, 110, 125, 150, 175, 200, or 225° C., and heat-treated at the temperature for 24 hours. Each of the surface of the silicon wafer with an oxide film and the surface of the lithium tantalate wafer to be bonded together had a surface roughness RMS of 1.0 nm or less. The result of the appearance inspection of each laminate thus obtained is shown in Table 1. The silicon wafer with an oxide film was obtained by heat-treating a silicon wafer at 1100° C. for about one hour to allow a 100-nm thermal oxide film to grow on the silicon wafer. It is confirmed that the laminate samples obtained using the silicon wafer with an oxide film as the support wafer and the heat treatment at 70 to 200° C. had neither cracking nor chipping.

<Experiment 4>

Laminates were obtained and heat-treated in the same manner as in Experiment 1 except that a glass wafer having a diameter of 100 mm and a thickness of 0.35 mm was used as the support wafer, and each laminate thus obtained was heated to a temperature of 70, 80, 90, 100, 110, or 125° C., and heat-treated at the temperature for 24 hours. Each of the surface of the glass wafer and the surface of the lithium tantalate wafer to be bonded together had a surface roughness RMS of 1.0 nm or less. The result of the appearance inspection of each laminate thus obtained is shown in Table 1. It is confirmed that the laminate samples obtained using a glass wafer as the support wafer and the heat treatment at 70 to 110° C. had neither cracking nor chipping.

TABLE 1

| kind of support wafer | temperature (° C.) of laminate during heat treatment | | | | | | | | | | | |
|---|---|---|---|---|---|---|---|---|---|---|---|---|
| | 70 | 80 | 90 | 100 | 110 | 125 | 150 | 175 | 200 | 225 | 250 | 275 |
| sapphire (Experiment 1) | A | A | A | A | A | A | A | A | A | A | B | F |
| silicon (Experiment 2) | A | A | A | A | A | A | A | A | A | B | — | — |
| silicon with oxide film (Experiment 3) | A | A | A | A | A | A | A | A | A | B | — | — |
| glass (Experiment 4) | A | A | A | A | A | B | — | — | — | — | — | — |

A lithium tantalate wafer was used in Experiments 1 to 4. When experiments were carried out in the same manner as in Experiments 1 to 4 except that a lithium niobate wafer was used as the oxide single-crystal wafer, the same results as those in Table 1 were obtained. When experiments were carried out in the same manner as in Experiments 1 to 4 except that ozone water treatment, UV ozone treatment, or vacuum ion beam treatment was used instead of the plasma treatment as the surface activation treatment, exactly same results were obtained. It is evident from those results that any of the above-described activation methods is effective, and there is no difference in the results between lithium tantalate and lithium niobate.

Example 1

A sapphire wafer having a diameter of 100 mm and a thickness of 0.35 mm was used as the support wafer, while a lithium tantalate wafer having a diameter of 100 mm and a thickness of 0.35 mm was used as the oxide single-crystal wafer. Each of the surface of the sapphire wafer and the surface of the lithium tantalate wafer to be bonded together had a surface roughness RMS of 1.0 nm or less.

First, an ion-implanted layer was formed inside the lithium tantalate wafer by implanting hydrogen atom ions from the surface of the lithium tantalate wafer under the following conditions: an implantation dose of $7.0 \times 10^{16}$ atom/cm$^2$ and an accelerating voltage of 100 KeV. Next, the surface of the lithium tantalate wafer from which the ions had been implanted and the surface of the sapphire wafer to be laminated with the lithium tantalate wafer were activated by vacuum ion beam treatment with a vacuum ion beam apparatus under $7 \times 10^{-6}$ Pa, while using Ar as an ion source. Next, the activated surfaces of the sapphire wafer and the lithium tantalate wafer were bonded together at room temperature (25° C.) to obtain each laminate. Next, each laminate thus obtained was heated to a temperature of 90, 100, 110, 125, 150, 175, 200, or 225° C., and heat-treated at the temperature for 24 hours. A heat treatment oven was used as a heater, and the atmospheric temperature in the oven was measured as the temperature of each laminate by using a thermocouple. The heat-treated laminate was allowed to stand until the temperature decreased to room temperature. Then, each laminate was split along the ion-implanted layer by applying ultrasonic waves (30 Hz) in the state of keeping a wedge-like blade of an ultrasonic cutter in contact with an end portion of the ion-implanted layer of the laminate at room temperature (25° C.) to obtain a composite wafer having a lithium tantalate film transferred onto the sapphire wafer. The result of the appearance inspection of each composite wafer thus obtained is shown in Table 2. This appearance inspection was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer was evaluated as "F".

Comparative Example 1

A composite wafer was obtained in the same manner as in Example 1 except that the laminate was heat-treated at 70° C. for 24 hours. The result of the appearance inspection of the composite wafer thus obtained is shown in Table 2.

Comparative Example 2

A composite wafer was obtained in the same manner as in Example 1 except that the laminate was heat-treated at 80° C. for 24 hours. The result of the appearance inspection of the composite wafer thus obtained is shown in Table 2.

Example 2

Each composite wafer was obtained in the same manner as in Example 1 except that a silicon wafer having a diameter of 100 mm and a thickness of 0.35 mm was used as the support wafer, and each laminate thus obtained was heated to a temperature of 90, 100, 110, 125, 150, 175, or 200° C., and heat-treated at the temperature for 24 hours. Each of the surface of the silicon wafer and the surface of the lithium tantalate wafer to be bonded together had a surface roughness RMS of 1.0 nm or less. The result of the appearance inspection of each composite wafer thus obtained is shown in Table 2.

Comparative Example 3

A composite wafer was obtained in the same manner as in Example 2 except that the laminate was heat-treated at 70° C. for 24 hours. The result of the appearance inspection of the composite wafer thus obtained is shown in Table 2.

Comparative Example 4

A composite wafer was obtained in the same manner as in Example 2 except that the laminate was heat-treated at 80° C. for 24 hours. The result of the appearance inspection of the composite wafer thus obtained is shown in Table 2.

Example 3

Each composite wafer was obtained in the same manner as in Example 1 except that a silicon wafer with an oxide film containing a silicon wafer having a diameter of 100 mm and a thickness of 0.35 mm and a 100-nm oxide film on the silicon wafer was used as the support wafer, and each laminate thus obtained was heated to a temperature of 90, 100, 110, 125, 150, 175, or 200° C., and heat-treated a the temperature for 24 hours. Each of the surface of the silicon wafer with an oxide film and the surface of the lithium tantalate wafer to be bonded together had a surface roughness RMS of 1.0 nm or less. The result of the appearance inspection of each composite wafer thus obtained is shown in Table 2. The silicon wafer with an oxide film was obtained by heat-treating a silicon wafer at 1100° C. for about one hour to allow a 100-nm thermal oxide film to grow on the silicon wafer.

Comparative Example 5

A composite wafer was obtained in the same manner as in Example 3 except that the laminate was heat-treated at 70° C. for 24 hours. The result of the appearance inspection of the composite wafer thus obtained is shown in Table 2.

Comparative Example 6

A composite wafer was obtained in the same manner as in Example 3 except that the laminate was heat-treated at 80° C. for 24 hours. The result of the appearance inspection of the composite wafer thus obtained is shown in Table 2.

Example 4

Each composite wafer was obtained in the same manner as in Example 1 except that a glass wafer having a diameter of 100 mm and a thickness of 0.35 mm was used as the support wafer, each laminate thus obtained was heated to a temperature of 90, 100, or 110° C., and heat-treated at the temperature for 24 hours. Each of the surface of the glass wafer and the surface of the lithium tantalate wafer to be bonded together had a surface roughness RMS of 1.0 nm or less. The result of the appearance inspection of each composite wafer thus obtained is shown in Table 2.

Comparative Example 7

A composite wafer was obtained in the same manner as in Example 4 except that the laminate was heat-treated at 70° C. for 24 hours. The result of the appearance inspection of the composite wafer thus obtained is shown in Table 2.

Comparative Example 8

A composite wafer was obtained in the same manner as in Example 4 except that the laminate was heat-treated at 80° C. for 24 hours. The result of the appearance inspection of the composite wafer thus obtained is shown in Table 2.

TABLE 2

| kind of support wafer | temperature (° C.) of laminate during heat treatment | | | | | | | | | | |
|---|---|---|---|---|---|---|---|---|---|---|---|
| | 70 | 80 | 90 | 100 | 110 | 125 | 150 | 175 | 200 | 225 | 250 |
| sapphire (Example 1 and Comp. Exs. 1-2) | F | B | A | A | A | A | A | A | A | A | — |
| silicon (Example 2 and Comp. Exs. 3-4) | F | B | A | A | A | A | A | A | A | — | — |
| silicon with oxide film (Example 3 and Comp. Exs. 5-6) | F | B | A | A | A | A | A | A | A | — | — |
| glass (Example 4 and Comp. Exs. 7-8) | F | B | A | A | A | — | — | — | — | — | — |

Regarding the composite wafer samples obtained by using a sapphire wafer as the support wafer and the heat treatment at 90 to 225° C., the composite wafer samples obtained by using a silicon wafer as the support wafer and the heat treatment at 90 to 200° C., the composite wafer samples obtained by using a silicon wafer with an oxide film as the support wafer and the heat treatment temperature at from 90 to 200° C., and the composite wafer samples obtained by using a glass wafer as the support wafer and the heat treatment at 90 to 110° C., it is confirmed that each lithium tantalate film was transferred onto the entire surface of each support wafer as shown in Table 2.

In any of the support wafers, when the heat treatment temperature was 70° C., there was no split along the ion-implanted layer and peeling occurred at the interface between the two wafers laminated together. When the heat treatment temperature was 80° C., there appeared two regions on the support wafer, that is, an area where a lithium tantalate film was transferred and an area where the film was not transferred. It is considered that the film was not transferred onto the entire surface because at 70° C. and 80° C., embrittlement at the ion implantation interface was not sufficient and a lamination force between the two wafers was not enough.

When experiments were carried out in the same manner as in Examples 1 to 4 except that a lithium niobate wafer was used as the oxide single-crystal wafer, the same results as those shown in Table 2 were obtained. When experiments were carried out in the same manner as in Examples 1 to 4 except that ozone water treatment, UV ozone treatment, or plasma treatment was used instead of the vacuum ion beam treatment as the surface activation treatment, the same results were obtained.

Example 5

Each composite wafer was obtained in the same manner as in Example 1 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 9

A composite wafer was obtained in the same manner as in Example 5 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Reference Example 1

A lithium tantalate wafer having a diameter of 100 mm and a thickness of 0.35 mm was used as the oxide single-crystal wafer. The surface of the lithium tantalate wafer to be bonded had a surface roughness RMS of 1.0 nm or less. An ion-implanted layer was formed inside the lithium tantalate wafer by implanting hydrogen atom ions from the surface of the lithium tantalate wafer under the following conditions: an implantation dose of $30 \times 10^{16}$ atom/cm$^2$ and an accelerating voltage of 100 KeV. As a result, a surface of the lithium tantalate wafer before lamination was found to have unevenness, which was not a surface roughness required for the lamination so that it was not laminated. The unevenness on the surface of the lithium tantalate wafer is presumed to occur because the implanted hydrogen failed to become dissolved and foamed inside the wafer.

Example 6

Each composite wafer was obtained in the same manner as in Example 2 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 10

A composite wafer was obtained in the same manner as in Example 6 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Example 7

Each composite wafer was obtained in the same manner as in Example 3 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 11

A composite wafer was obtained in the same manner as in Example 7 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

Example 8

Each composite wafer was obtained in the same manner as in Example 4 except that an ion-implanted layer was formed inside the lithium tantalate wafer by implanting hydrogen atom ions from the surface of the lithium tantalate wafer under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, or $27.5 \times 10^{16}$ atom/cm$^2$, and an accelerating voltage of 100 KeV, and each laminate thus obtained was heat-treated at 90° C. for 24 hours.

Comparative Example 12

A composite wafer was obtained in the same manner as in Example 8 except that an ion-implanted layer was formed inside the lithium tantalate wafer by implanting hydrogen atom ions from the surface of the lithium tantalate wafer under the following conditions: an implantation dose of $4.0 \times 10^{16}$ atom/cm$^2$ and an accelerating voltage of 100 KeV.

It is confirmed that in Examples 5 to 8 in which hydrogen atom ions were implanted at an implantation dose of from $5.0 \times 10^{16}$ to $27.5 \times 10^{16}$ atom/cm$^2$, a lithium tantalate film was transferred onto the entire surface of the support wafer irrespective of the kind of the support wafer. On the other hand, in Comparative Examples 9 to 12 in which hydrogen atom ions were implanted at an implantation dose of $4.0 \times 10^{16}$ atom/cm$^2$, there was no split along the ion-implanted layer of the lithium tantalate wafer irrespective of the kind of the support wafer. It is presumed that the ion implantation dose was insufficient so that sufficient embrittlement was not caused in the later step.

Hydrogen atom ions were used in Examples 5 to 8. The similar results were obtained when hydrogen molecule ions were used and the implantation dose of the hydrogen molecule ions was reduced to half of that of the hydrogen atom ions. Further, the results similar to those of Examples 5 to 8 were obtained when a lithium niobate wafer was used as the oxide single-crystal wafer.

Example 9

Each composite wafer having a lithium tantalate film transferred onto the sapphire wafer was obtained in the same manner as in Example 1 except that each heat-treated laminate was allowed to stand until it was cooled to room temperature, and then immersed in a water tank of 25° C., and ultrasonic waves (26 kHz) were applied to the water tank for 120 seconds by using a ultrasonic washing machine so that ultrasonic vibration was applied to the laminate via water to split the laminate along the ion-implanted layer. The result of the appearance inspection of each composite wafer thus obtained is shown in Table 3. The appearance inspection was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer was evaluated as "F".

Comparative Example 13

A composite wafer was obtained in the same manner as in Example 9 except that the laminate was heat-treated at 70°

C. for 24 hours. The result of the appearance inspection of the composite wafer thus obtained is shown in Table 3.

Comparative Example 14

A composite wafer was obtained in the same manner as in Example 9 except that the laminate was heat-treated at 80° C. for 24 hours. The result of the appearance inspection of the composite wafer thus obtained is shown in Table 3.

Example 10

Each composite wafer having a lithium tantalate film transferred onto the silicon wafer was obtained in the same manner as in Example 2 except that the heat-treated laminate was allowed to stand until it was cooled to room temperature, and then immersed in a water tank of 25° C., and ultrasonic waves (26 kHz) were applied to the water tank for 120 seconds by using a ultrasonic washing machine so that ultrasonic vibration was applied to the laminate via water to split the laminate along the ion-implanted layer. The result of the appearance inspection of each composite wafer thus obtained is shown in Table 3.

Comparative Example 15

A composite wafer was obtained in the same manner as in Example 10 except that the laminate was heat-treated at 70° C. for 24 hours. The result of the appearance inspection of the composite wafer thus obtained is shown in Table 3.

Comparative Example 16

A composite wafer was obtained in the same manner as in Example 10 except that the laminate was heat-treated at 80° C. for 24 hours. The result of the appearance inspection of the composite wafer thus obtained is shown in Table 3.

Comparative Example 17

A composite wafer was obtained in the same manner as in Example 11 except that the laminate was heat-treated at 70° C. for 24 hours. The result of the appearance inspection of the composite wafer thus obtained is shown in Table 3.

Comparative Example 18

A composite wafer was obtained in the same manner as in Example 11 except that the laminate was heat-treated at 80° C. for 24 hours. The result of the appearance inspection of the composite wafer thus obtained is shown in Table 3.

Example 12

Each composite wafer having a lithium tantalate film transferred onto the glass wafer was obtained in the same manner as in Example 4 except that each heat-treated laminate was allowed to stand until it was cooled to room temperature, and then immersed in a water tank of 25° C., and ultrasonic waves (26 kHz) were applied to the water tank for 120 seconds by using a ultrasonic washing machine so that ultrasonic vibration was applied to the laminate via water to split the laminate along the ion-implanted layer. The result of the appearance inspection of each composite wafer thus obtained is shown in Table 3.

Comparative Example 19

A composite wafer was obtained in the same manner as in Example 12 except that the laminate was heat-treated at 70° C. for 24 hours. The result of the appearance inspection of the composite wafer thus obtained is shown in Table 3.

Comparative Example 20

A composite wafer was obtained in the same manner as in Example 12 except that the laminate was heat-treated at 80° C. for 24 hours. The result of the appearance inspection of the composite wafer thus obtained is shown in Table 3.

TABLE 3

| kind of support wafer | temperature (° C.) of laminate during heat treatment ||||||||||| 
| | 70 | 80 | 90 | 100 | 110 | 125 | 150 | 175 | 200 | 225 | 250 |
| --- | --- | --- | --- | --- | --- | --- | --- | --- | --- | --- | --- |
| sapphire (Example 9 and Comp. Exs. 13-14) | F | B | A | A | A | A | A | A | A | A | — |
| silicon (Example 10 and Comp. Exs. 15-16) | F | B | A | A | A | A | A | A | A | — | — |
| silicon with oxide film (Example 11 and Comp. Exs. 17-18) | F | B | A | A | A | A | A | A | A | — | — |
| glass (Example 12 and Comp. Exs. 19-20) | F | B | A | A | A | — | — | — | — | — | — |

Example 11

Each composite wafer having a lithium tantalate film transferred onto the silicon wafer with an oxide film was obtained in the same manner as in Example 3 except that each heat-treated laminate was allowed to stand until it was cooled to room temperature, and then immersed in a water tank of 25° C., and ultrasonic waves (26 kHz) were applied to the water tank for 120 seconds by using a ultrasonic washing machine so that ultrasonic vibration was applied to the laminate via water to split the laminate along the ion-implanted layer. The result of the appearance inspection of each composite wafer thus obtained is shown in Table 3.

Regarding the composite wafer samples obtained by using a sapphire wafer as the support wafer and the heat treatment at 90 to 225° C., the composite wafer samples obtained by using a silicon wafer as the support wafer and the heat treatment at from 90 to 200° C., the composite wafer samples obtained by using a silicon wafer with an oxide film as the support wafer and the heat treatment at 90 to 200° C., and the composite wafer samples obtained by using a glass wafer as the support wafer and the heat treatment at 90 to 110° C., it was confirmed that as shown in Table 3, a lithium tantalate film had been transferred onto the entire surface of each support wafer.

When the heat treatment temperature was 70° C., splitting did not occur at the ion-implanted layer but occurred at the interface of the two wafers laminated together. When the heat treatment temperature was 80° C., the support wafer had two areas, that is, an area onto which a lithium tantalate film was transferred and an area onto which a lithium tantalate film was not transferred. It is presumed that insufficient embrittlement at the ion implantation interface and lack of a bonding force between the two wafers at 70° C. and 80° C. result in failure in transfer to the entire surface.

Each experiment was carried out in the same manner as in any of Examples 9 to 12 using a lithium niobate wafer as the oxide single-crystal wafer. The results are the same as those shown in Table 3. The results are also exactly the same when the surface activation treatment was carried out by using ozone water treatment, UV ozone treatment, or plasma treatment in place of the vacuum ion beam treatment.

EXPLANATION OF SYMBOLS

11: oxide single-crystal wafer
11s: surface of oxide single-crystal wafer
11a: oxide single-crystal film
11b: a portion of oxide single-crystal wafer after split
12: hydrogen ion
13: ion-implanted layer
14: support wafer
14s: surface of support wafer
15: ion beam for exposition
16: laminate
18: composite wafer
19: wedge-like blade of ultrasonic cutter
31: water tank
32: liquid in water tank
33: vibrator

The invention claimed is:

1. A method of producing a composite wafer having an oxide single-crystal film on a support wafer, comprising steps of:
    implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;
    subjecting at least one of the surface of the oxide single-crystal wafer and a surface of a support wafer to be laminated with the oxide single-crystal wafer to surface activation treatment;
    after the surface activation treatment, bonding the surface of the oxide single-crystal wafer to the surface of the support wafer to obtain a laminate;
    heat-treating the laminate at a temperature of 90° C. or higher at which cracking is not caused; and
    applying ultrasonic vibration to the heat-treated laminate to split the laminate along the ion-implanted layer to obtain an oxide single-crystal film transferred onto the support wafer;
    wherein an implantation dose of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$.

2. The method of producing a composite wafer according to claim 1, wherein the support wafer is selected from the group consisting of a sapphire wafer, a silicon wafer, a silicon wafer with an oxide film and a glass wafer, and the temperature in the step of heat-treating is from 90 to 225° C. in a case where the support wafer is the sapphire wafer; from 90° C. to 200° C. in a case where the support wafer is the silicon wafer or the silicon wafer with an oxide film; and from 90 to 110° C. in a case where the support wafer is the glass wafer.

3. The method of producing a composite wafer according to claim 1, wherein a difference between a temperature at the bonding to obtain the laminate and a temperature of the laminate during the application of the ultrasonic vibration is from 0 to 40° C.

4. The method of producing a composite wafer according to claim 1, wherein the surface activation treatment is selected from the group consisting of ozone water treatment, UV ozone treatment, ion beam treatment, and plasma treatment.

5. The method of producing a composite wafer according to claim 1, wherein the step of applying ultrasonic vibration comprises bringing a vibrator into contact with a side surface of the laminate.

6. The method of producing a composite wafer according to claim 1, wherein the step of applying ultrasonic vibration includes applying the ultrasonic vibration to the laminate via a liquid.

* * * * *